United States Patent
Ohyama et al.

(10) Patent No.: US 10,166,869 B1
(45) Date of Patent: Jan. 1, 2019

(54) ELECTRONIC COMPONENT UNIT, WIRE HARNESS, AND CONNECTOR FIXING STRUCTURE

(71) Applicants: Yazaki Corporation, Tokyo (JP);
Mitsubishi Electric Corporation, Tokyo (JP)

(72) Inventors: Kouichi Ohyama, Shizuoka (JP);
Mitsunori Nishida, Tokyo (JP); Osamu Nishizawa, Tokyo (JP)

(73) Assignees: YAZAKI CORPORATION, Minato-ku, Tokyo (JP); Mitsubishi Electric Corporation, Chiyoda-ku, Tokyo (JP)

( * ) Notice: Subject to any disclaimer, the term of this patent is extended or adjusted under 35 U.S.C. 154(b) by 0 days.

(21) Appl. No.: 15/862,979

(22) Filed: Jan. 5, 2018

(30) Foreign Application Priority Data

Jun. 21, 2017  (JP) .................................. 2017-121579

(51) Int. Cl.
| H05K 5/00 | (2006.01) |
| B60K 35/00 | (2006.01) |
| B60R 16/02 | (2006.01) |
| H05K 7/14 | (2006.01) |

(52) U.S. Cl.
CPC .......... B60K 35/00 (2013.01); B60R 16/0215 (2013.01); H05K 7/1402 (2013.01); H05K 7/1432 (2013.01); B60K 2350/1064 (2013.01)

(58) Field of Classification Search
CPC .... H05K 7/1402; H05K 7/1432; B60K 35/00; B60K 2350/1064; B60R 16/0215
USPC ......................................... 361/801–802, 759
See application file for complete search history.

(56) References Cited

U.S. PATENT DOCUMENTS

| 5,707,249 | A | * | 1/1998 | Byrd | ................... | H01M 2/1055 |
| | | | | | | 361/767 |
| 6,139,362 | A | * | 10/2000 | Brown | ..................... | H05K 7/12 |
| | | | | | | 439/381 |
| 6,312,287 | B1 | * | 11/2001 | Harting | ................ | H01R 9/0515 |
| | | | | | | 439/581 |
| 2001/0049209 | A1 | * | 12/2001 | Casey | ................ | H01R 13/6275 |
| | | | | | | 439/76.1 |
| 2009/0186520 | A1 | * | 7/2009 | Kondo | .................... | H05K 3/301 |
| | | | | | | 439/567 |
| 2013/0196544 | A1 | * | 8/2013 | Little | ..................... | H01R 12/71 |
| | | | | | | 439/626 |

(Continued)

FOREIGN PATENT DOCUMENTS

| JP | 4-25166 U | 2/1992 |
| JP | 6-15284 U | 2/1994 |
| JP | 2003-249775 A | 9/2003 |

*Primary Examiner* — Hung S. Bui
(74) *Attorney, Agent, or Firm* — Sughrue Mion, PLLC

(57) ABSTRACT

An electronic component unit of a wire harness includes a substrate on which an electronic component is mounted, a connector electrically connected to the substrate, and a connector fixing structure. The connector fixing structure includes a pair of notches that are provided facing each other on ends of the substrate in a long-side direction and that penetrate through the substrate in a plate thickness direction, a pair of press fitting plates that are provided on the connector and that are press-fitted into the respective notches, and a deformation acceptable space that is provided adjacent to each of both sides of the press fitting plates press-fitted into the respective notches in the long-side direction.

6 Claims, 5 Drawing Sheets

(56) References Cited

U.S. PATENT DOCUMENTS

2014/0308850 A1\* 10/2014 Song .................... H01R 4/2404
439/620.15

\* cited by examiner

ELECTRONIC COMPONENT UNIT, WIRE HARNESS, AND CONNECTOR FIXING STRUCTURE

CROSS-REFERENCE TO RELATED APPLICATION(S)

The present application claims priority to and incorporates by reference the entire contents of Japanese Patent Application No. 2017-121579 filed in Japan on Jun. 21, 2017.

BACKGROUND OF THE INVENTION

1. Field of the Invention

The present invention relates to an electronic component unit, a wire harness, and a connector fixing structure.

2. Description of the Related Art

For example, as a technique relating to a conventional electronic component unit applied to a wire harness and the like in a vehicle, Japanese Patent Application Laid-open No. 2003-249775 discloses a substrate fixing structure for fixing a measuring instrument. In the substrate fixing structure, a substrate is fixed to the inner surface of a casing of the measuring instrument, by forcibly press-fitting a press fitting boss projecting from the inner surface of the casing into a fixing hole formed on the substrate. In the substrate fixing structure, peripheral walls for defining a sealed space around the press fitting boss are projecting from the inner walls of the casing so as to surround the press fitting boss, by bringing the tip end portions of the peripheral walls into contact with the substrate.

For example, in the substrate fixing structure disclosed in Japanese Patent Application Laid-open No. 2003-249775 disclosed above, a connector is provided on the substrate in some cases. In such cases, the fixing structure of the connector to the substrate can stand further improvement.

SUMMARY OF THE INVENTION

The present invention has been made in view of the above circumstances, and the object of the present invention is to provide an electronic component unit, a wire harness, and a connector fixing structure capable of suitably fixing the connector to the substrate.

In order to achieve the above mentioned object, an electronic component unit according to one aspect of the present invention includes a substrate on which an electronic component is mounted; a connector electrically connected to the substrate; and a connector fixing structure including: a pair of notches that are provided facing each other on ends of the substrate in a long-side direction and that penetrate through the substrate in a plate thickness direction, a pair of press fitting plates that are provided on the connector and that are press-fitted into the respective notches, and a deformation acceptable space that is provided adjacent to each of both sides of the press fitting plates that are press-fitted into the respective notches in the long-side direction.

According to another aspect of the present invention, in the electronic component unit, it is possible to configure that between the substrate and the connector, a linear expansion coefficient of the substrate is relatively small and a linear expansion coefficient of the connector is relatively large.

In order to achieve the above mentioned object, a wire harness according to still another aspect of the present invention includes a conductive wiring material; and an electronic component unit electrically connected to the wiring material, wherein the electronic component unit includes: a substrate on which an electronic component electrically connected to the wiring material is mounted, a connector electrically connected to the substrate, and a connector fixing structure including: a pair of notches that are provided facing each other on ends of the substrate in a long-side direction and that penetrate through the substrate in a plate thickness direction, a pair of press fitting plates that are provided on the connector and that are press-fitted into the respective notches, and a deformation acceptable space that is provided adjacent to each of both sides of the press fitting plates that are press-fitted into the respective notches in the long-side direction.

In order to achieve the above mentioned object, a connector fixing structure according to still another aspect of the present invention includes a pair of notches that are provided facing each other on ends of a substrate on which an electronic component is mounted in a long-side direction and that penetrate through the substrate in a plate thickness direction; a pair of press fitting plates that are provided on a connector electrically connected to the substrate and that are press-fitted into the respective notches; and a deformation acceptable space that is provided adjacent to each of both sides of the press fitting plates that are press-fitted into the respective notches in the long-side direction.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, an embodiment according to the present invention will be described in detail with reference to the accompanying drawings. It is to be noted that the present invention is not limited to the embodiment. Moreover, components in the following embodiment include components that can be easily replaced by a person skilled in the art or components that are substantially the same.

Figure 1:
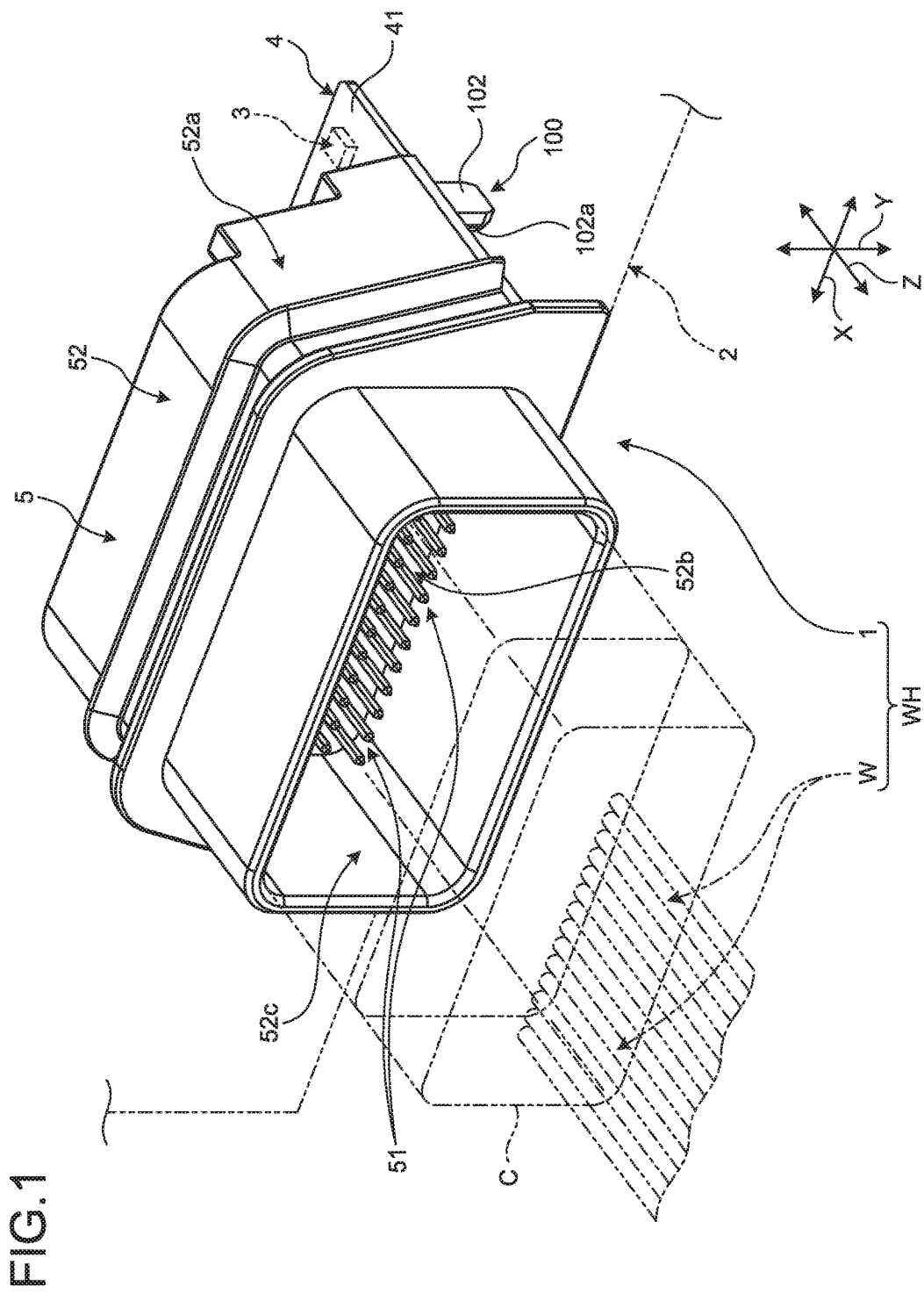
FIG. 1 is a perspective view illustrating a schematic configuration of an electronic component unit according to an embodiment.
Figure 2:
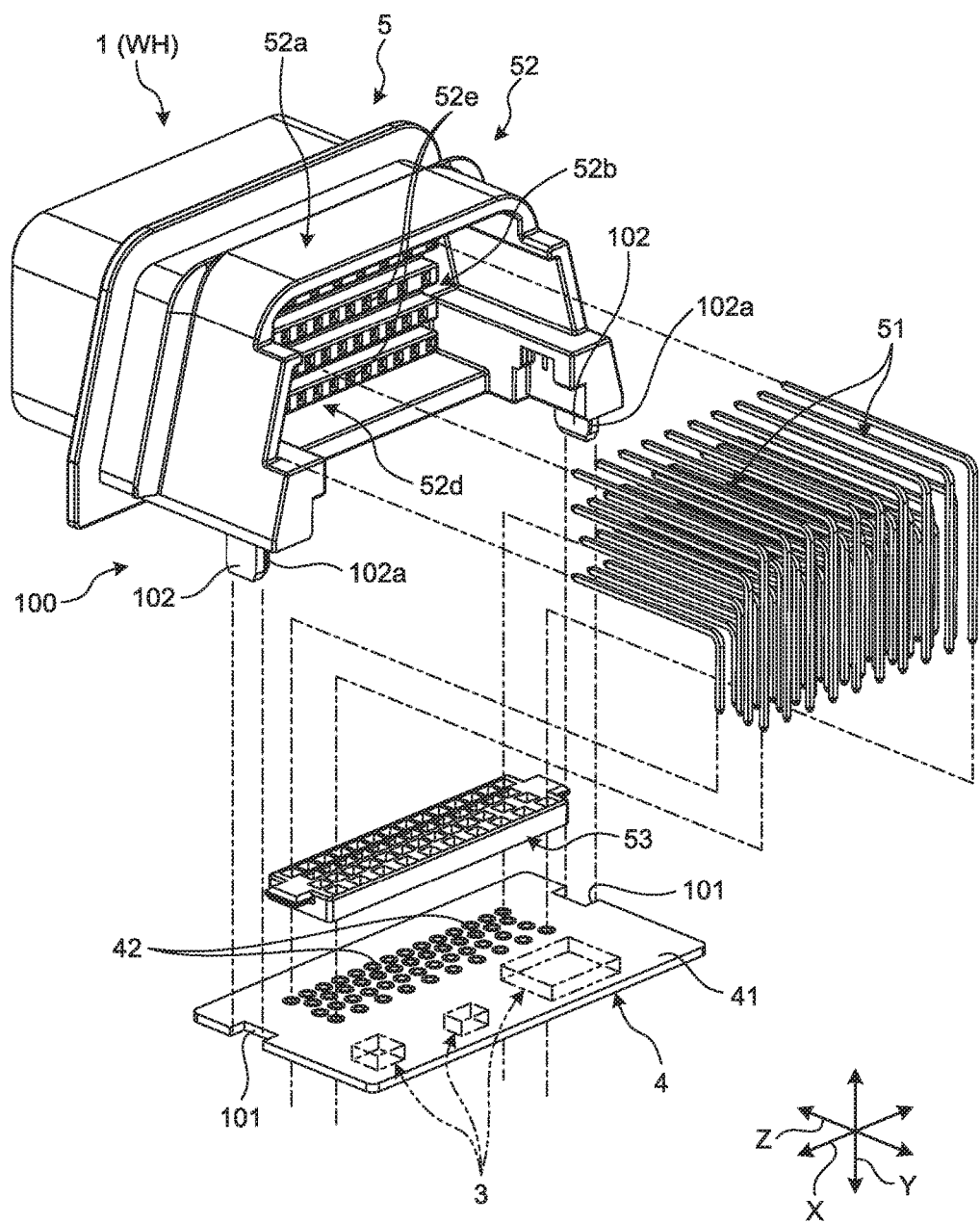
FIG. 2 is an exploded perspective view illustrating a schematic configuration of the electronic component unit according to the embodiment.

In FIG. 1, a part of a casing, a mating connector, and wiring materials are simply illustrated by two-dot chain lines, and in the other drawings, illustrations of the casing, the mating connector, and the wiring materials are omitted. In FIG. 1 and FIG. 2, a part of electronic components to be mounted on a substrate is simply illustrated by the two-dot chain lines, and in the other drawings, illustrations of the electronic components are omitted. In the following explanation, in a first direction, a second direction, and a third direction that are intersecting with each other, the first direction is referred to as a "width direction X", the second direction is referred to as a "height direction Y", and the third direction is referred to as a "depth direction Z". In this example, the width direction X, the height direction Y, and the depth direction Z are orthogonal to each other. Typically, the width direction X corresponds to a long-side direction of a substrate and an opposing direction of a pair of notches, which will be described below. Typically, the height direction Y corresponds to a plate thickness direction of the substrate, which will be described below. Typically, the depth direction Z is an intersecting direction intersecting with the width direction X and the height direction Y, and corresponds to a short-side direction of the substrate, which will be described below. Unless otherwise specified, the directions used in the following description are directions that are set while the units are assembled with each other and the electronic component unit is mounted on a vehicle.

EMBODIMENT

For example, an electronic component unit 1 illustrated in FIG. 1 is mounted on a vehicle such as an automobile, and is incorporated in a wire harness WH. For example, the wire harness WH connects between devices mounted on the vehicle by bundling a plurality of wiring materials W used for supplying power and communicating signals into a collective component, and by connecting the wiring materials W with the devices using a connector and the like. The wire harness WH includes the wiring materials W, which is conductive, and the electronic component unit 1 that is electrically connected to the wiring materials W. For example, the wiring materials W are formed of metal rods, wires, wire bundles, and the like. The metal rods are obtained by coating the outside of a conductive rod-shaped member with an insulating coating part. The wires are obtained by coating the outside of a conductor (core wire) made of a plurality of conductive metal strands with an insulating coating part. The wire bundles are obtained by bundling the wires. In the wire harness WH, the wiring materials W are collectively bundled, and the electronic component unit 1 is electrically connected via a mating connector C or the like that is provided on the terminal of the bundled wiring materials W. The wire harness WH may also include a grommet, a protector, a fixing tool, and the like. For example, the electronic component unit 1 is installed in an engine room and the like in a vehicle and implements various functions. The electronic component unit 1 of the present embodiment can suitably fix a connector 5 by fixing the connector 5 to a substrate 4 that is housed inside a casing 2 through a connector fixing structure 100.

Hereinafter, a configuration of the electronic component unit 1 will be described in detail with reference to the accompanying drawings.

Figure 3:
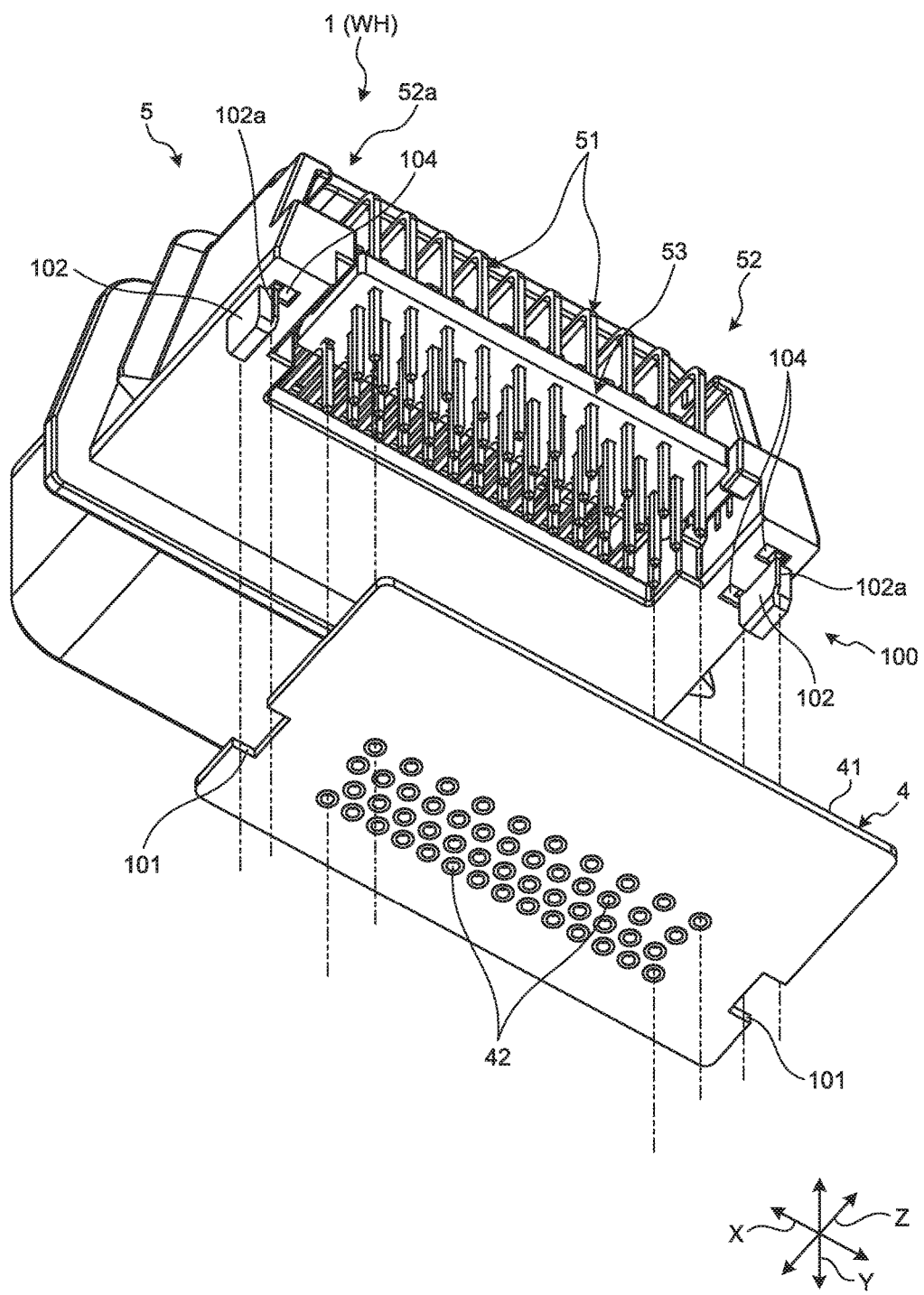
FIG. 3 is an exploded perspective view illustrating a schematic configuration of the electronic component unit according to the embodiment.
Figure 4:
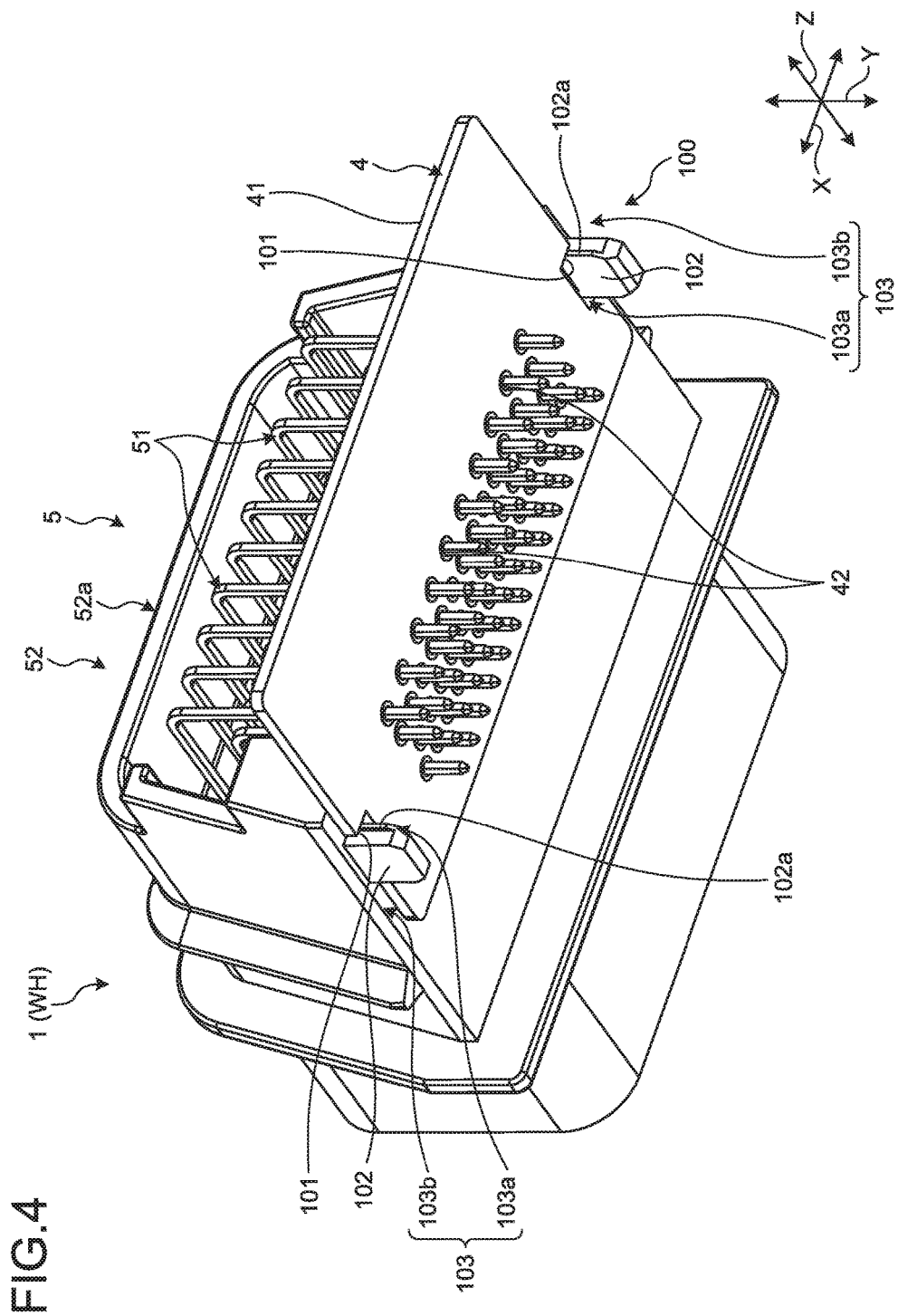
FIG. 4 is a perspective view illustrating a schematic configuration of the electronic component unit according to the embodiment.

As illustrated in FIG. 1, FIG. 2, and FIG. 3, the electronic component unit 1 of the present embodiment includes the casing 2, an electronic component 3, the substrate 4, the connector 5, and the connector fixing structure 100.

The casing 2 houses units of the electronic component unit 1. The casing 2 is made of an insulating resin material. The casing 2 has a hollow box shape, and houses the units of the electronic component unit 1 including the electronic component 3, the substrate 4, the connector 5, and the like.

The electronic component 3 is an element housed inside the casing 2 and exerts various functions. The electronic component 3 is electrically connected to the wiring materials W. The electronic component 3 is provided in plurality. For example, the electronic components 3 include a capacitor, a relay, a resistance, a transistor, a fuse, a connector, an intelligent power switch (IPS), an electronic control unit including a microcomputer, and the like.

The electronic components 3 are provided on the substrate 4, and the substrate 4 is housed inside the casing 2 with the electronic components 3. The substrate 4 is also electrically connected to the wiring materials W. The electronic components 3 are mounted on a mounting surface 41 of the substrate 4, and the substrate 4 forms an electronic circuit that electrically connects the electronic components 3. In this example, the substrate 4 is what is called a printed circuit board (PCB), for example. In the substrate 4, wiring patterns (print patterns) formed of a conductive material such as copper are printed on an insulating layer made of an insulating material such as epoxy resin, glass epoxy resin, paper epoxy resin, and a ceramic. Consequently, a circuit is configured by the wiring patterns. The substrate 4 has a substantially rectangular plate shape so that the height direction Y is the plate thickness direction, the width direction X is the long-side direction, and the depth direction Z is the extending direction of the sides. The electronic components 3 are mounted on the mounting surface 41 of the substrate 4, when lead wires and terminals of the electronic components 3 are electrically connected to the circuit by soldering and the like. In this example, the substrate 4 at least includes a plurality of through holes 42 electrically connected to the connector 5, which will be described below. Each of the through holes 42 penetrates through the substrate 4 in the height direction Y. The circuit of the substrate 4 electrically connects the electronic components 3 with the connector 5, and configures a circuit system according to the requested functions. It is to be noted that the substrate 4 is not limited to the printed circuit board, and may also be what is called an insert bus bar substrate in which a bus bar made of a conductive metal material is incorporated in the inside made of an insulating resin material. In this case, for example, the substrate 4 is obtained by coating a bus bar as a circuit made of a conductive metal material with an insulating resin material.

The connector 5 is electrically connected to the substrate 4, and forms what is called a PCB connector. The connector 5 configures a wire-to-board connection mechanism for electrically connecting the substrate 4 with the mating connector C provided on the terminal of the wiring materials W. The connector 5 includes a plurality of bent terminals 51, a connector housing 52, and an aligning plate 53. Each of the bent terminals 51 electrically connects the substrate 4 with the mating connector C.

The bent terminals 51 are configured of a metal material that is entirely conductive and the like, and conductive plating and the like is applied on the surface. Each of the bent terminals 51 is a rectangular wire formed in a rod shape and is bent in a substantially L-shape. The connector housing 52 houses and retains the bent terminals 51. Moreover, the connector housing 52 is a portion to which the mating connector C can be fitted. The connector housing 52 is made of an insulating resin material. The connector housing 52 includes a hood portion 52a, a terminal retaining portion 52b, a fitting space 52c, and a substrate side space 52d, and the connector housing 52 is integrally formed by the hood portion 52a, the terminal retaining portion 52b, the fitting space 52c, and the substrate side space 52d.

The hood portion 52a is formed in a tube shape corresponding to the exterior shape of the mating connector C. In this example, the hood portion 52a is formed in a substantially rectangular tube shape having an axis in the depth direction Z. Both ends of the hood portion 52a in the depth direction Z are opened. The terminal retaining portion 52b is formed on the middle part of the hood portion 52a in the depth direction Z, as a partition wall for closing the inside of the hollow-shaped hood portion 52a. The space inside the hood portion 52a is partitioned into the fitting space 52c and the substrate side space 52d by the terminal retaining portion 52b. The fitting space 52c is a space where a part of the bent terminals 51 is exposed and into which the mating connector C can be fitted. The substrate side space 52d is a space at the side where the substrate 4 and the like are placed. A plurality of cavities (retaining through holes) 52e (see FIG. 2) are formed on the terminal retaining portion 52b. Each of the cavities 52e penetrates through the terminal retaining portion 52b in the depth direction Z, and communicatively connects the fitting space 52c with the substrate side space 52d. The aligning plate 53 is attached to the ends of the bent terminals 51 at the side to be connected to the substrate 4, and adjusts the intervals between the bent terminals 51, aligns the bent terminals 51, and the like.

In the connector 5, one of the ends of the bent terminals 51 is press-fitted into the cavities 52e of the terminal retaining portion 52b from the substrate side space 52d side. Consequently, the terminal retaining portion 52b retains the bent terminals 51. In the connector 5, one of the ends of the bent terminals 51 is exposed in the fitting space 52c, while the terminal retaining portion 52b is retaining the bent terminals 51. In the connector 5, the other ends of the bent terminals 51 are directed toward the same side in the height direction Y, and the aligning plate 53 is attached to the other ends of the bent terminals 51.

In the connector 5, the other ends of the bent terminals 51 are electrically connected to the substrate 4. The bent terminals 51 are electrically connected to the circuit, when the respective ends of the bent terminals 51 at the aligning plate 53 side are inserted and soldered into the respective through holes 42 in the substrate 4 or the like. The mating connector C is fitted into the connector 5. Consequently, the bent terminals 51 are electrically connected to the mating connector C, and the substrate 4 is electrically connected to the wiring materials W. The connector 5 may also retain the bent terminals 51 in the terminal retaining portion 52b, by insert-molding one of the ends of the bent terminals 51 into the terminal retaining portion 52b.

As illustrated in FIG. 2, FIG. 3, FIG. 4, and FIG. 5, the connector fixing structure 100 is used to fix the connector 5 configured as the above to the substrate 4. The connector fixing structure 100 of the present embodiment includes a pair of notches 101, a pair of press fitting plates 102, and a deformation acceptable space 103 (see especially FIG. 4 and FIG. 5).

The pair of notches 101 are portions on the substrate 4 where the connector 5 is to be fixed. The pair of notches 101 are provided facing each other on the ends of the substrate 4 in the long-side direction, in other words, on the ends of the substrate 4 in the width direction X. Each of the notches 101 penetrates through the substrate 4 in the height direction Y. The sectional shape of the notch 101 is formed in a substantially rectangular shape.

The pair of press fitting plates 102 are portions provided on the connector 5 and are press-fitted into the respective notches 101. The press fitting plates 102 may also be referred to as press fitting bosses. Each of the press fitting plates 102 is formed so as to project from the connector housing 52 of the connector 5 in the height direction Y. More specifically, the press fitting plate 102 is formed on a portion of the hood portion 52a of the connector housing 52 at the substrate side space 52d side. The press fitting plate 102 is formed so as to project from one of the surfaces of the portion of the hood portion 52a at the substrate side space 52d side in the height direction Y, toward the same side as the bending side of the bent terminals 51 in the height direction Y. The pair of press fitting plates 102 are placed facing each other in the width direction X. One of the pair of press fitting plates 102 is press-fitted into one of the pair of notches 101, and the other press fitting plate 102 is press-fitted into the other notch 101. The press fitting plate 102 is formed in a substantially rectangular plate shape so that the width direction X is the plate thickness direction. The press fitting plate 102 is also formed in a tapered shape so that the tip end portion is tapered. Crush ribs 102a are formed on both respective end surfaces of the press fitting plates 102 in the depth direction Z. The crush rib 102a is a portion to be crushed when the press fitting plate 102 is press-fitted into the notch 101, and is formed in a straight line in the height direction Y.

The deformation acceptable space 103 is a space provided adjacent to each of both sides of the press fitting plates 102 that are press-fitted into the notches 101 in the width direction X, respectively. More specifically, in the connector fixing structure 100, the deformation acceptable space 103 includes a single deformation acceptable space 103a and a single deformation acceptable space 103b for each combination of a single notch 101 and a single press fitting plate 102. The deformation acceptable space 103a is formed adjacent to the inside of the facing direction of the press fitting plates 102 that are press-fitted into the notches 101. In this example, the inside of the facing direction is a space side sandwiched between the pair of press fitting plates 102 that are facing each other in the width direction X. In this example, the deformation acceptable space 103a is formed as a space inside the notch 101 that is surrounded by the press fitting plate 102 press-fitted into the notch 101 and the end surface of the substrate 4 forming the notch 101. As will be described below, the deformation acceptable space 103a functions as a retraction space during thermal contraction where the press fitting plate 102 is to be retracted when the substrate 4 and the connector 5 are thermally contracted. On the other hand, the deformation acceptable space 103b is formed adjacent to the outside of the facing direction of the press fitting plates 102 that are press-fitted into the notches 101. In this example, the outside of the facing direction is an opposite side of the space sandwiched by the pair of press fitting plates 102 that are facing each other in the width direction X. In this example, the deformation acceptable space 103b is formed as a space outside the notch 101 than the press fitting plate 102 that is press-fitted into the notch 101. As will be described below, the deformation acceptable space 103b functions as a retraction space during thermal expansion where the press fitting plate 102 is to be retracted when the substrate 4 and the connector 5 are thermally expanded. In the following explanation, the deformation acceptable space 103a and the deformation acceptable space 103b may be simply referred to as the "deformation acceptable space 103", when there is no need to particularly differentiate between the deformation acceptable space 103a and the deformation acceptable space 103b.

Moreover, in the connector fixing structure 100 of the present embodiment, a groove 104 (see FIG. 3) is formed at the root portion of each of the press fitting plates 102 in the connector housing 52. The groove 104 is provided at each of both ends of the root portion of the press fitting plate 102 in the depth direction Z. The grooves 104 are formed in a substantially rectangular recessed shape so as to surround the ends of the crush rib 102a.

In the electronic component unit 1 configured as the above, the connector 5 is fixed to the substrate 4 through the connector fixing structure 100. In other words, in the electronic component unit 1, the connector 5 is fixed to the substrate 4 when the press fitting plates 102 provided on the connector 5 are press-fitted into the notches 101 provided on the substrate 4, respectively. In this process, in the electronic component unit 1, scraps of resin from the portion of the crush rib 102a are to be housed in the grooves 104. The scraps of resin are generated when the press fitting plates 102 are press-fitted into the notches 101. Consequently, the electronic component unit 1 can prevent scraps of resin from adhering and the like to the units in the electronic component unit 1.

In the electronic component unit 1 of the present embodiment, the deformation acceptable space 103 is provided on each of both sides of the press fitting plates 102 that are press-fitted into the notches 101 in the width direction X, while the connector 5 is fixed to the substrate 4 through the connector fixing structure 100. The units in the electronic component unit 1 may be thermally deformed according to heat generated from the electronic components 3, influence of the environmental temperature, and the like. In such a case, in the electronic component unit 1, difference may be generated between the thermal deformation amounts of the substrate 4 and the connector housing 52 due to difference between the linear expansion coefficients of the substrate 4 and the connector housing 52. However, with the above configuration of the electronic component unit 1, the difference between the thermal deformation amounts of the substrate 4 and the connector housing 52 can be absorbed by the portion of the deformation acceptable space 103. In other words, in such a case, in the electronic component unit 1, the press fitting plate 102 moves relative to the notch 101 in the width direction X, corresponding to the difference between the thermal deformation amounts of the substrate 4 and the connector housing 52, while the press fitting plate 102 is press-fitted into the notch 101. Consequently, in the electronic component unit 1, the press fitting plate 102 can be moved and retracted into one of the deformation acceptable spaces 103, corresponding to the difference between the thermal deformation amounts of the substrate 4 and the connector housing 52.

In this example, typically, the linear expansion coefficient of the substrate 4 is relatively small, and the linear expansion coefficient of the connector housing 52 is relatively large, between the substrate 4 and the connector housing 52 of the connector 5. Thus, in the electronic component unit 1, the thermal deformation amount of the substrate 4 tends to be relatively small, and the thermal deformation amount of the connector housing 52 tends to be relatively large, when the substrate 4 and the connector housing 52 are thermally deformed. Consequently, a difference is generated between the thermal deformation amounts of the substrate 4 and the connector housing 52.

Figure 5:
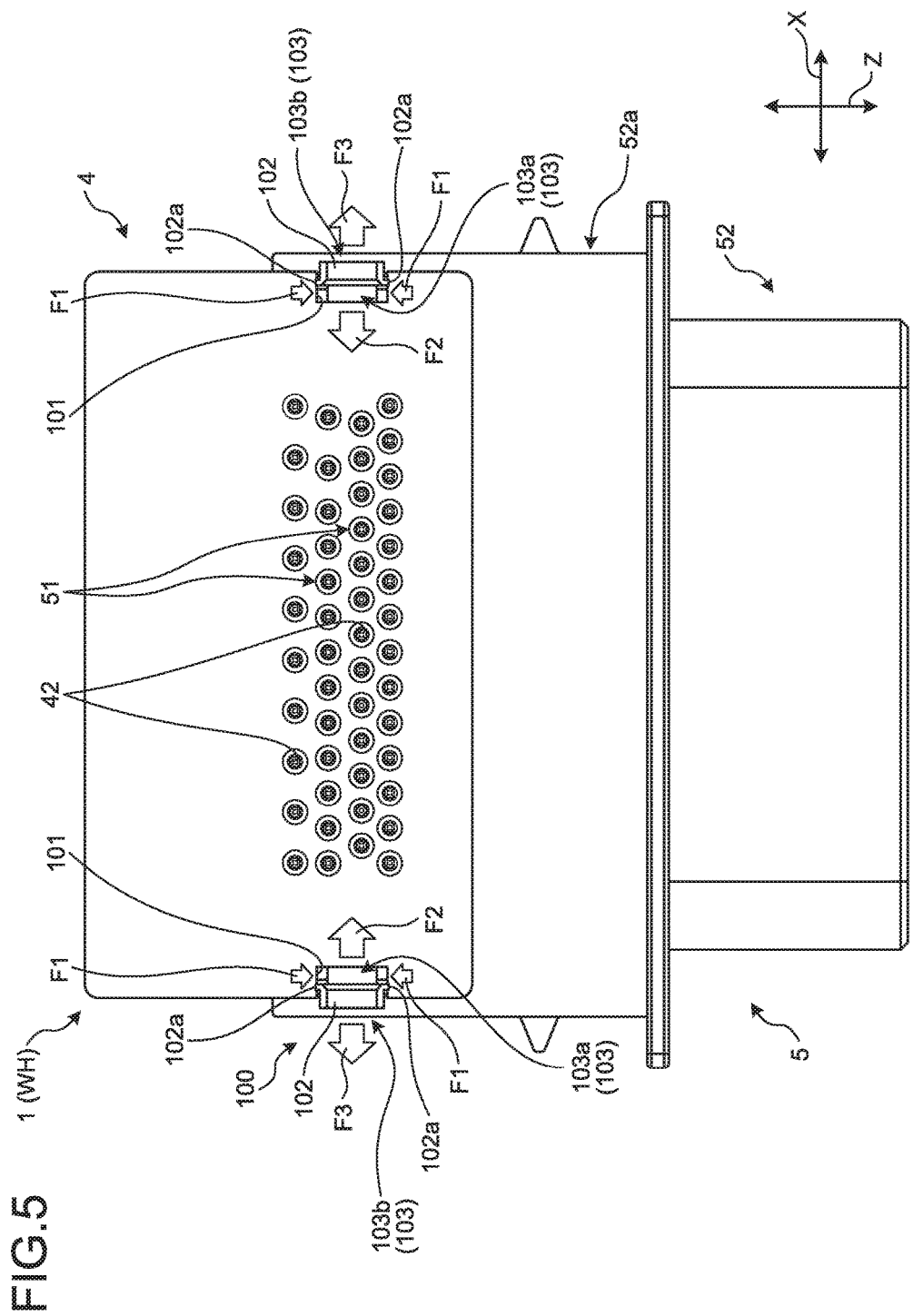
FIG. 5 is a plan view illustrating a schematic configuration of the electronic component unit according to the embodiment.

For example, in the electronic component unit 1, when the substrate 4 and the connector housing 52 are thermally contracted according to the temperature change and the like, the thermal contraction amount of the substrate 4 becomes relatively small, and the thermal contraction amount of the connector housing 52 becomes relatively large. As a result, a difference is generated between the thermal contraction amounts of the substrate 4 and the connector housing 52. Typically, as illustrated in FIG. 5, the units in the electronic component unit 1 are set so that press-fitting retaining force F1 of the press fitting plates 102 relative to the notches 101 becomes smaller than force F2 to displace the notch 101 and the press fitting unit 102 relative to each other in the width direction X during thermal contraction. As a result, in the electronic component unit 1, the press fitting plate 102 can move to the deformation acceptable space 103a side in the width direction X relative to the notch 101, and the press fitting plate 102 can be retracted in the deformation acceptable space 103a during thermal contraction.

On the other hand, in the electronic component unit 1, when the substrate 4 and the connector housing 52 are thermally expanded according to the temperature change and the like, the thermal expansion amount of the substrate 4 becomes relatively small, and the thermal expansion amount of the connector housing 52 becomes relatively large. As a result, a difference is generated between the thermal expansion amounts of the substrate 4 and the connector housing 52. Typically, as illustrated in FIG. 5, the units in the electronic component unit 1 are set so that the press-fitting retaining force F1 of the press fitting plates 102 relative to the notches 101 becomes smaller than force F3 to displace the notch 101 and the press fitting plate 102 relative to each other in the width direction X during thermal expansion. As a result, in the electronic component unit 1, the press fitting plate 102 can move to the deformation acceptable space 103b side in the width direction X relative to the notch 101, and the press fitting plate 102 can be retracted in the deformation acceptable space 103b during thermal expansion.

In this manner, in the electronic component unit 1, even if a difference is generated between the thermal deformation amounts of the substrate 4 and the connector housing 52, the press fitting plate 102 can move relative to the notch 101 in the width direction X, during thermal contraction and during thermal expansion. As a result, the electronic component unit 1 can prevent the press fitting plate 102 and the substrate 4 from interfering with each other during thermal contraction and during thermal expansion. Consequently, it is possible to prevent an excessive stress from being applied to the substrate 4 from the press fitting plate 102.

In the electronic component unit 1, the wire harness WH, and the connector fixing structure 100 described above, the connector 5 can be fixed to the substrate 4 by press-fitting the press fitting plates 102 provided on the connector 5 into the notches 101 provided on the substrate 4, respectively. In the connector fixing structure 100, the deformation acceptable space 103 is provided on each of both sides of the press fitting plates 102 that are press-fitted into the notches 101 in the width direction X, while the connector 5 is fixed to the substrate 4. With this configuration, in the connector fixing structure 100, it is possible to absorb the difference between the thermal deformation amounts with the portion of the deformation acceptable space 103, even if a difference is generated between the thermal deformation amounts of the substrate 4 and the connector housing 52, due to the difference between the linear expansion coefficients of the substrate 4 and the connector housing 52. Furthermore, in the connector fixing structure 100, the press fitting plate 102 is press-fitted and fixed in the short-side direction, in this example, in the depth direction Z of the substrate 4 that tends to have a relatively small difference between the thermal deformation amounts when the temperature is changed. On the other hand, in the connector fixing structure 100, the deformation acceptable space 103 for absorbing the difference between the thermal deformation amounts is provided on each of both sides of the press fitting plate 102 in the long-side direction, in this example, in the width direction X of the substrate 4 that tends to have a relatively large difference between the thermal deformation amounts when the temperature is changed.

With this configuration, in the connector fixing structure 100, the press fitting plate 102 can be securely press-fitted and fixed in the depth direction Z toward which the influence of thermal deformation is small. The difference between the thermal deformation amounts can then be absorbed for both thermal contraction and thermal expansion in the width direction X toward which the influence of thermal deformation is large. As a result, the electronic component unit 1, the wire harness WH, and the connector fixing structure 100 can suitably fix the connector 5 to the substrate 4.

In this example, in the electronic component unit 1, the wire harness WH, and the connector fixing structure 100 described above, the linear expansion coefficient of the substrate 4 is set to be relatively small, and the linear expansion coefficient of the connector housing 52 of the connector 5 is set to be relatively large. In this case, in the electronic component unit 1, the wire harness WH, and the connector fixing structure 100, the thermal deformation amount of the connector housing 52 side of the connector 5 tends to be relatively large. However, even in such a case, the electronic component unit 1, the wire harness WH, and the connector fixing structure 100 can suitably fix the connector 5 to the substrate 4.

The electronic component unit, the wire harness, and the connector fixing structure according to the embodiment of the present invention described above are not limited to those in the above described embodiment, and various modifications may be made within the scope of the appended claims.

The connector fixing structure 100 described above includes the groove 104. However, it is not limited thereto.

The substrate 4 described above has a substantially rectangular plate shape. However, it is not limited thereto. The substrate 4 may also have a substantially polygonal plate shape other than the substantially rectangular plate shape. Even in this case, the pair of notches 101 may be provided facing each other on the ends of the substrate 4 in the long-side direction.

In the electronic component unit, the wire harness, and the connector fixing structure according to the present embodiment, the press fitting plates provided on the connector are press-fitted into the notches provided on the substrate, respectively. Consequently, the connector can be fixed to the substrate. In the connector fixing structure, the deformation acceptable space is provided on each of both sides of the press fitting plates that are press-fitted into the notches in the long-side direction, respectively, while the connector is fixed to the substrate. With this configuration, the connector fixing structure can absorb the difference between the thermal deformation amounts with the portion of the deformation acceptable space, even if a difference is generated between the thermal deformation amounts of the substrate and the connector, due to the difference between the linear expansion coefficients of the substrate and the connector. As a result, the electronic component unit, the wire harness, and the connector fixing structure exhibit advantageous effects of being able to suitably fix the connector to the substrate.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electronic component unit, comprising:
   a substrate on which an electronic component is mounted;
   a connector electrically connected to the substrate; and
   a connector fixing structure including:
      a pair of notches that are provided opposite each other on opposing ends of the substrate in a long-side direction and that penetrate through the substrate in a plate thickness direction,
      a pair of press fitting plates that are provided on the connector and that are press-fitted into the respective notches, and
      a deformation acceptable space that is provided adjacent to each of both sides of the press fitting plates that are press-fitted into the respective notches in the long-side direction, such that a first side of the deformation acceptable space is provided between each of the pair of press fitting plates and the substrate in the long-side direction and a second side of the deformation acceptable space is provided on each side of the pair of press fitting plates opposite the first side.

2. The electronic component unit according to claim 1, wherein
   between the substrate and the connector, a linear expansion coefficient of the substrate is relatively small and a linear expansion coefficient of the connector is relatively large.

3. The electronic component unit according to claim 1, wherein the connector fixing structure further includes a groove formed in the plate thickness direction at the root portion of each of the press fitting plates.

4. The electronic component unit according to claim 3, wherein the grooves receive respective portions of the pair of press fitting plates when the pair of press-fitting plates are press-fitted into the notches.

5. A wire harness, comprising:
   a conductive wiring material; and
   an electronic component unit electrically connected to the wiring material, wherein
   the electronic component unit includes:
      a substrate on which an electronic component electrically connected to the wiring material is mounted,
      a connector electrically connected to the substrate, and
      a connector fixing structure including:
         a pair of notches that are provided opposite each other on opposing ends of the substrate in a long-side direction and that penetrate through the substrate in a plate thickness direction,
         a pair of press fitting plates that are provided on the connector and that are press-fitted into the respective notches, and
         a deformation acceptable space that is provided adjacent to each of both sides of the press fitting plates that are press-fitted into the respective notches in the long-side direction, such that a first side of the deformation acceptable space is provided between each of the air of press fitting plates and the substrate in the long-side direction and a second side of the deformation acceptable space is provided on each side of the pair of press fitting, plates opposite the first side.

6. A connector fixing structure, comprising:

a pair of notches that are provided opposite each other on opposing ends of a substrate on which an electronic component is mounted in a long-side direction and that penetrate through the substrate in a plate thickness direction;

a pair of press fitting plates that are provided on a connector electrically connected to the substrate and that are press-fitted into the respective notches; and a deformation acceptable space that is provided adjacent to each of both sides of the press fitting plates that are press-fitted into the respective notches in the long-side direction, such that a first side of the deformation acceptable space is provided between each of the pair of press fitting plates and the substrate in the long-side direction and a second side of the deformation acceptable space is provided on each side of the pair of press fitting plates opposite the first side.

* * * * *